United States Patent
Lee et al.

(10) Patent No.: US 7,994,523 B2
(45) Date of Patent: Aug. 9, 2011

(54) AC LIGHT EMITTING DIODE HAVING IMPROVED TRANSPARENT ELECTRODE STRUCTURE

(75) Inventors: Jae Ho Lee, Yongin-si (KR); Yeo Jin Yoon, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 366 days.

(21) Appl. No.: 12/088,999

(22) PCT Filed: Nov. 28, 2006

(86) PCT No.: PCT/KR2006/005050
§ 371 (c)(1),
(2), (4) Date: Apr. 2, 2008

(87) PCT Pub. No.: WO2007/083884
PCT Pub. Date: Jul. 26, 2007

(65) Prior Publication Data
US 2008/0217629 A1 Sep. 11, 2008

(30) Foreign Application Priority Data
Dec. 16, 2005 (KR) .................. 10-2005-0124256

(51) Int. Cl.
*H01L 33/00* (2010.01)
(52) U.S. Cl. ............... 257/88; 257/96; 257/99; 257/103
(58) Field of Classification Search .................. 257/88, 257/96, 99, 103
See application file for complete search history.

(56) References Cited

U.S. PATENT DOCUMENTS
7,417,259 B2 * 8/2008 Sakai et al. ..................... 257/88
7,615,798 B2 * 11/2009 Sanga et al. ..................... 257/99
(Continued)

FOREIGN PATENT DOCUMENTS
DE 19517697 11/1996
(Continued)

OTHER PUBLICATIONS

Taiwan Intellectual Property Office Preliminary Notice of the First Office Action dated Jan. 20, 2010.

(Continued)

*Primary Examiner* — Howard Weiss
*Assistant Examiner* — Steven Rao
(74) *Attorney, Agent, or Firm* — H.C. Park & Associates, PLC

(57) ABSTRACT

Disclosed is an AC light emitting diode having an improved transparent electrode structure. The light emitting diode comprises a plurality of light emitting cells formed on a single substrate, each of the light emitting cells having a first conductive type semiconductor layer, a second conductive type semiconductor layer positioned on one region of the first conductive type semiconductor layer, and an active layer interposed between the first and second conductive type semiconductor layers. A transparent electrode structure is positioned on each of the light emitting cells. The transparent electrode structure includes at least two portions separated from each other, or a center portion and branches laterally extending from both sides of the center portion. Meanwhile, wires electrically connect adjacent two of the light emitting cells. Accordingly, a plurality of light emitting cells are electrically connected, whereby a light emitting diode can be provided which can be driven under AC power source. Also, an improved transparent electrode structure is employed, so that the current density can be prevented from being locally increased.

7 Claims, 4 Drawing Sheets

U.S. PATENT DOCUMENTS

2005/0253151 A1   11/2005   Sakai et al.

FOREIGN PATENT DOCUMENTS

| | | |
|---|---|---|
| DE | 102004021175 | 11/2005 |
| EP | 1553641 | 7/2005 |
| JP | 09107125 | 4/1997 |
| JP | 2000-068555 | 3/2000 |
| JP | 2004-014899 | 1/2004 |
| KR | 10-2002-0084710 | 11/2002 |
| TW | 574759 | 2/2004 |
| TW | 583774 | 4/2004 |
| TW | I224876 | 12/2004 |
| TW | 200501464 | 1/2005 |
| WO | 2004-023568 | 3/2004 |

OTHER PUBLICATIONS

German Office Action dated Jan. 26, 2009.
TW Preliminary Notice of the First Office Action dated Aug. 25, 2010, May 20, 2011.

* cited by examiner

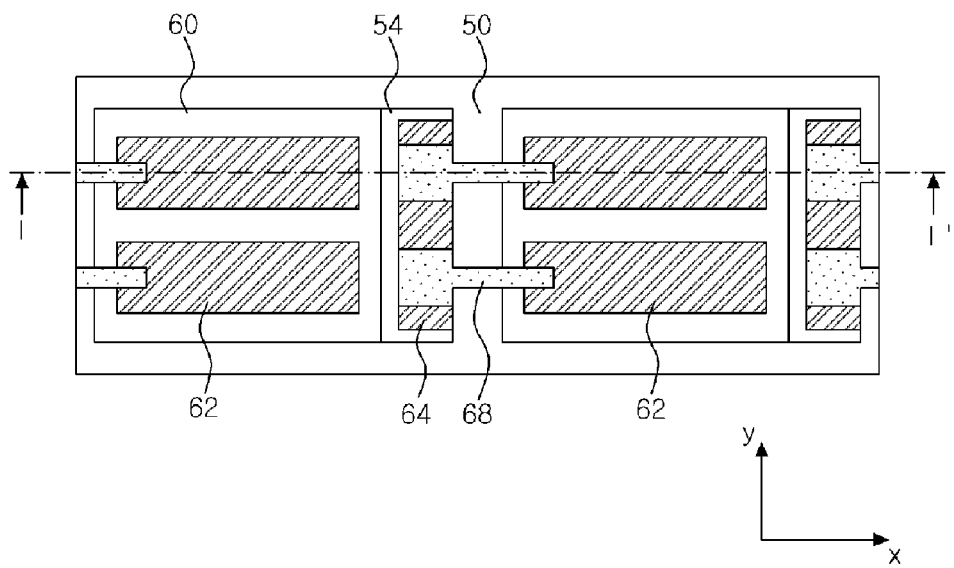
[Fig. 3]
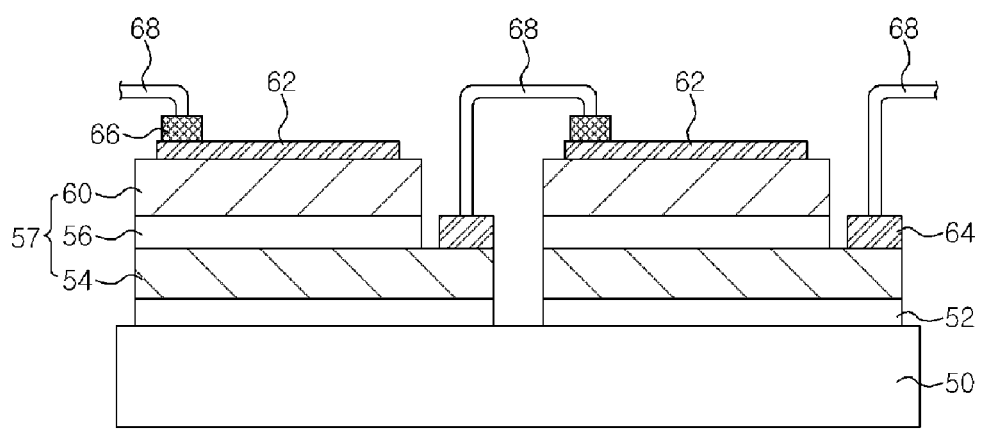
[Fig. 4]

[Fig. 5]
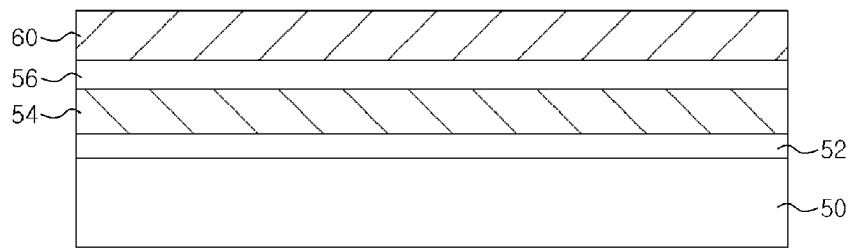
[Fig. 6]
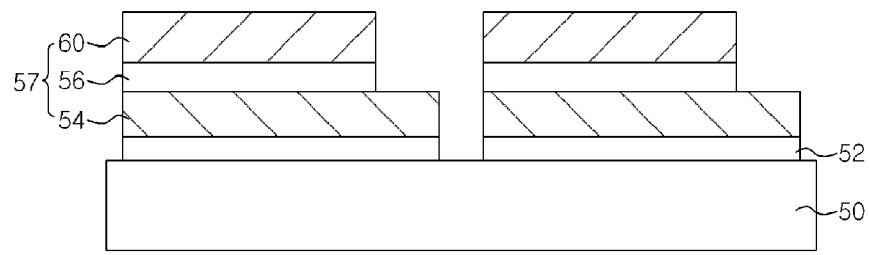
[Fig. 7]
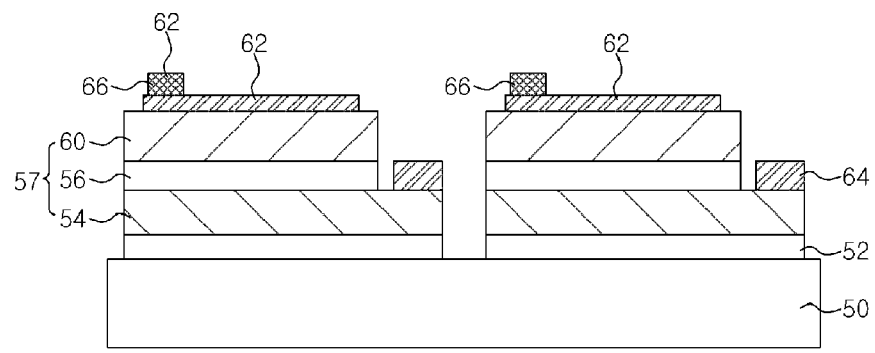
[Fig. 8]
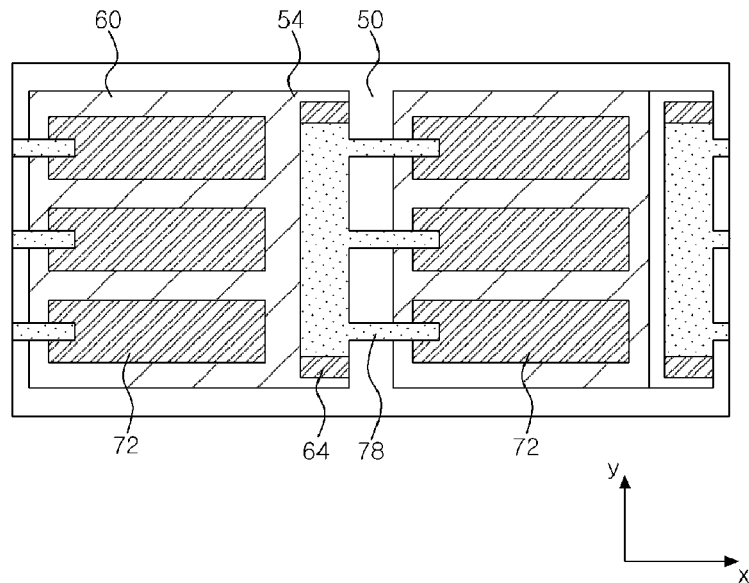

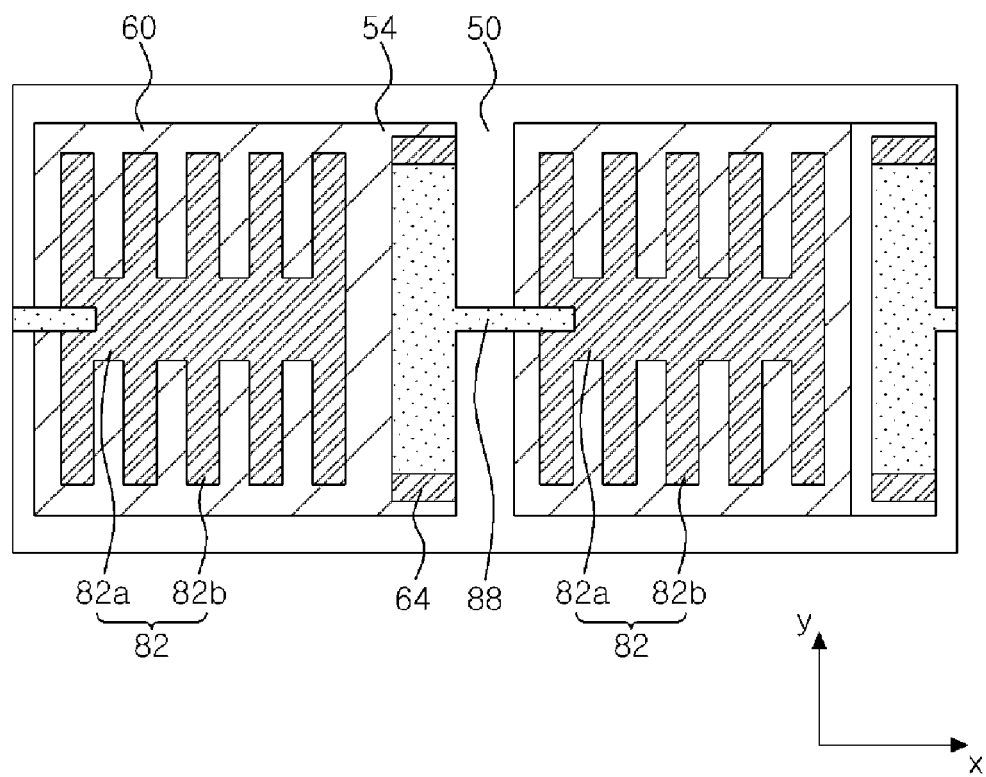
[Fig. 9]

ated on Nov. 28, 2006, and claims priority from and the benefit of Korean Patent Application No. 10-2005-0124256, filed on Dec. 16, 2005, which are both hereby incorporated by reference for all purposes as if fully set forth herein.

BACKGROUND OF THE INVENTION

1. Field of the Invention

The present invention relates to an AC light emitting diode (LED), and more particularly, to an AC LED having an improved transparent electrode structure.

2. Discussion of the Background

GaN based light emitting diodes (LEDs) have been applied and developed for about 10 years. The GaN based LEDs have considerably changed LED technologies and currently are used for a variety of applications, such as full color LED displays, LED traffic signals and white LEDs. Recently, high-efficiency white LEDs are expected to replace fluorescent lamps. Particularly, the efficiency of the white LED reaches a level similar to that of general fluorescent lamps.

In general, an LED emits light by forward current and requires the supply of DC. Therefore, when the LED is used by being directly connected to an AC power source, the LED is repeatedly turned on/off depending on the direction of the current. As a result, there is a problem in that the LED does not continuously emit light, and may be easily damaged due to reverse current.

In order to solve such a problem of the LED, an LED that can be used by being directly connected to a high-voltage AC power source has been disclosed in PCT Publication No. WO 2004/023568(A1), entitled "LIGHT-EMITTING DEVICE HAVING LIGHT-EMITTING ELEMENTS" by SAKAI et al.

FIG. 1 is a partial plan view illustrating the AC LED according to PCT Publication No. WO 2004/023568(A1), and FIG. 2 is a sectional view taken along line IV-IV in FIG. 1.

Referring to FIGS. 1 and 2, a plurality of light emitting cells 1 are formed on a substrate 10. Further, a p-electrode 22 and n-electrode 24 are provided on each of the light emitting cells 1. Air-bridge wires 28 electrically connect the p- and n-electrodes 22 and 24 of the light emitting cells adjacent to each other, so that the plurality of light emitting cells 1 are connected in series.

Each of the light emitting cells comprises n-GaN layer 14 and p-GaN layer 20. Although not shown, an InGaN active layer may be interposed between the n-GaN and p-GaN layers 14 and 20. The p-electrode 22 is formed on the p-GaN layer 20, and the n-electrode 24 is formed on the n-GaN layer 14. Meanwhile, the air-bridge wires 28 electrically connect the n- and p-electrodes 22 and 24.

According to PCT Publication No. WO2004/023568(A1), LEDs (light emitting cells) are two-dimensionally connected in series on an insulative substrate such as a sapphire substrate to form an LED array. Such two LED arrays are connected in reverse parallel on the sapphire substrate. As a result, a single chip light emitting device that can be driven by means of an AC power supply is provided.

However, when the p- and n-electrodes 22 and 24 are connected through the air-bridge wires 28 as shown in FIG. 1, the forward current flowing through the air-bridge wires 28 is locally concentrated on a region of each of the p-electrodes 22. Accordingly, the current density is increased in the region of each of the p-electrodes 22 and the current density in the other region thereof is relatively lowered. The local increase of the current density can not only limit a light emitting region of an active layer but also cause a peeling phenomenon of the p-electrode 22 due to the excessive current density. Further, the local increase of the current density increases a junction temperature in its region, thus reducing the light emitting efficiency. In a case where current is increased in order to obtain high output power, such problems become worse. Therefore, there is required an LED in which the current is prevented from being locally concentrated on the p-electrodes 22 and is uniformly dispersed in the entire p-electrodes.

SUMMARY OF THE INVENTION

An object of the present invention is to provide an AC light emitting diode suitable for preventing the current from being locally concentrated in light emitting cells, and allowing the current to be uniformly dispersed.

In order to achieve the object of the present invention, an AC light emitting diode according to one aspect of the present invention comprises a plurality of light emitting cells formed on a single substrate. Each of the light emitting cells includes a first conductive type semiconductor layer, a second conductive type semiconductor layer positioned on top of one region of the first conductive type semiconductor layer, and an active layer interposed between the first and second conductive type semiconductor layers. Meanwhile, a transparent electrode structure is positioned on each of the light emitting cells. The transparent electrode structure includes at least two portions separated from each other. In addition, wires electrically connect adjacent two of the light emitting cells. The wires electrically connect each of the at least two portions of the transparent electrode structure positioned on one of the adjacent two light emitting cells to the first conductive type semiconductor layer of other of the adjacent two light emitting cells.

According to the aspect of the present invention, the separate portions of the transparent electrode structure are connected to the first conductive type semiconductor layer adjacent thereto, so that the current flowing into the transparent electrode structure can be dispersed, thereby preventing the local increase of the current density.

Each of the at least two portions of the transparent electrode structure may have a shape elongated in a direction in which current flows between the light emitting cells. Accordingly, the current flowing in the transparent electrode structure is also uniformly dispersed in each of the portions.

Meanwhile, an n-type electrode may be formed on other region of the first conductive type semiconductor layer in each of the light emitting cells, and p-type electrode pads may be respectively formed on the at least two portions of the transparent electrode structure on each of the light emitting cells. At this time, the wires electrically connect the n-type electrodes and the p-type electrode pads.

To achieve the object of the present invention, an AC light emitting diode according to other aspect of the present invention has a modified transparent electrode structure. That is, in the other aspect of the present invention, the transparent electrode structure is positioned on each of the light emitting cells, and has a center portion and branches laterally extending from both sides of the center portion. Accordingly, the current flows along the center portion and also to ends of the branches, so that the current can be uniformly dispersed.

Meanwhile, each of wires electrically connects adjacent two of the light emitting cells so that the transparent electrode structure positioned on one of the adjacent two light emitting cells is electrically connected to the first conductive type semiconductor layer of other of the adjacent two light emitting cells.

In addition, the center portion may have a shape elongated in a direction in which current flows between the light emitting cells. Further, the branches extend perpendicular to the direction in which the current flows between the light emitting cells. Accordingly, the current can be prevented from being locally concentrated even in the center portion.

Further, an n-type electrode may be formed on other region of the first conductive type semiconductor layer in each of the light emitting cells, and a p-type electrode pad may be formed on the center portion of the transparent electrode structure on each of the light emitting cells. At this time, each of the wires electrically connects the n-type electrode and the p-type electrode pad.

According to the present invention, an AC light emitting diode can be provided which can prevent the current from being locally concentrated in light emitting cells, and allow the current to be uniformly dispersed. Therefore, it is possible to prevent a peeling phenomenon of a p-electrode due to excessive current locally concentrated. Further, the current is uniformly dispersed in an entire region of a light emitting cell, so that light emitting efficiency can be enhanced. Furthermore, since the current is uniformly dispersed, the current can be increased as compared with a prior art, and thus an AC light emitting diode with a high output power can be provided.

BRIEF DESCRIPTION OF THE DRAWINGS

FIG. 3 is a plan view illustrating an AC LED according to an embodiment of the present invention.

FIG. 4 is a sectional view taken along line I-I' in FIG. 3 for illustrating the AC LED according to the embodiment of the present invention.

FIGS. 5 to 7 are sectional views illustrating a method of manufacturing the AC LED according to the embodiment of the present invention.

FIGS. 8 and 9 are plan views illustrating AC LEDs according to other embodiments of the present invention.

DETAILED DESCRIPTION OF THE ILLUSTRATED EMBODIMENTS

Figure 1:
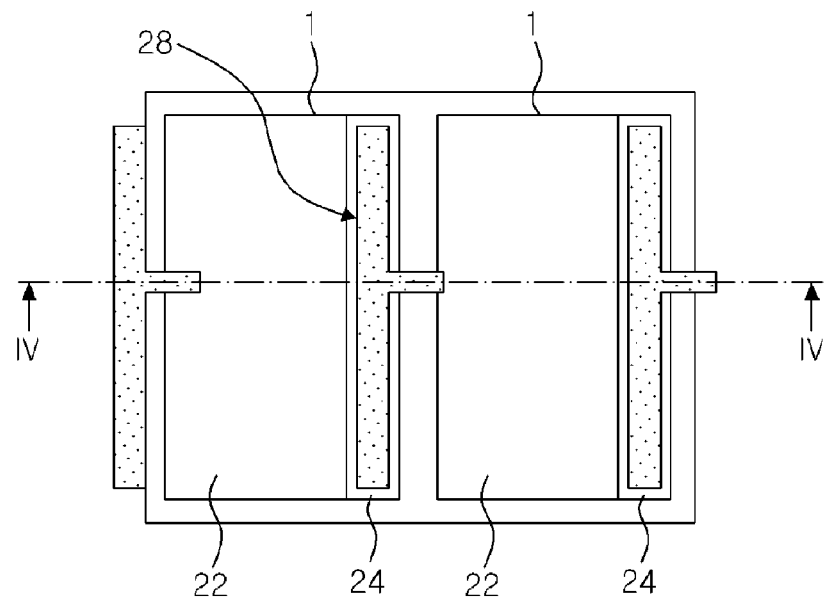
FIG. 1 is a plan view illustrating a conventional AC light emitting diode (LED)
Figure 2:
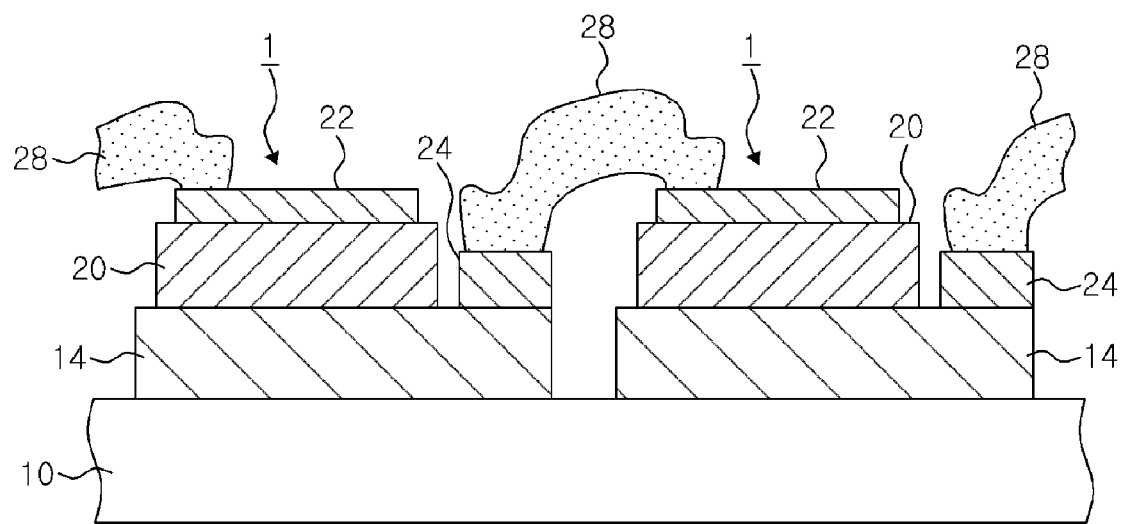
FIG. 2 is a sectional view taken along line IV-IV in FIG. 1.

Hereinafter, preferred embodiments of the present invention will be described in detail with reference to the accompanying drawings. The following embodiments are provided only for illustrative purposes so that those skilled in the art can fully understand the spirit of the present invention. Therefore, the present invention is not limited to the following embodiments but may be embodied in other forms. In the drawings, widths, lengths, thicknesses and the like of elements are exaggerated for convenience of illustration. Like reference numerals indicate like elements throughout the specification and drawings.

FIG. 3 is a plan view illustrating an AC light emitting diode (LED) according to an embodiment of the present invention, and FIG. 4 is a sectional view taken along line I-I' in FIG. 3.

Referring to FIGS. 3 and 4, a plurality of light emitting cells 57 are positioned on a single substrate 50. The substrate 50 may be an insulative or conductive substrate.

Each of the light emitting cells 57 comprises a first conductive type semiconductor layer 54, a second conductive type semiconductor layer 60 positioned on one region of the first conductive type semiconductor layer, and an active layer 56 interposed between the first and second conductive type semiconductor layers. Here, the first and second conductive types are n-type and p-type, or p-type and n-type, respectively.

Each of the first conductive type semiconductor layer 54, the active layer 56 and the second conductive type semiconductor layer 60 may be formed of a GaN based semiconductor material, i.e., (B, Al, In, Ga)N. A composition element and a composition ratio of the active layer 56 are determined such that the active layer 56 emits light with a desired wavelength, e.g., ultraviolet light or blue light. Each of the first and second conductive type semiconductor layers 54 and 60 is formed of a material with a band gap larger than that of the active layer 56.

As shown in the figures, the first conductive type semiconductor layer 54 and/or the second conductive type semiconductor layer 60 may be formed in a single or multiple layer structure. Further, the active layer 56 may have a single or multiple quantum well structure.

Meanwhile, a buffer layer 52 may be interposed between the light emitting cells 57 and the substrate 50. The buffer layer 52 is employed to reduce lattice mismatch between the substrate 50 and the first conductive type semiconductor layer 54 to be formed thereon.

An n-type electrode 64 may be formed on other region of the first conductive type semiconductor layer 54, i.e., a region thereof adjacent to the region in which the second conductive type semiconductor layer 60 is formed. The n-type electrode 64 is in ohmic contact with the first conductive type semiconductor layer 54. Meanwhile, a transparent electrode structure 62 is positioned on the second conductive type semiconductor layer 60. The transparent electrode structure 62 is in ohmic contact with the second conductive type semiconductor layer 60, and transmits the light emitted from the active layer 56.

As show in FIG. 3, the transparent electrode structure 62 comprises at least two separate portions. Preferably, each of the portions has a shape elongated in the direction, in which the current flows to drive the light emitting cells 57, i.e., the x direction.

Meanwhile, a p-type electrode pad 66 may be formed on each of the portions. The p-type electrode pad 66 may be in contact with the second conductive type semiconductor layer 60 by passing through the transparent electrode structure 62. In such a case, it is preferred that the contact resistance between the p-type electrode pad 66 and the second conductive type semiconductor layer 60 be relatively high.

As shown in the figures, wires 68 electrically connect the first conductive type semiconductor layers 54 and the transparent electrode structures 62 of the light emitting cells adjacent to each other. Each of the wires is formed of a conductive material, e.g., metal. The wires 68 electrically connect the respective two portions of the transparent electrode structure 62 to the first conductive type semiconductor layer 54 of the light emitting cell adjacent thereto. Meanwhile, in a case where the n-type electrodes 64 and the p-type electrode pads 66 are formed, the wires 68 may electrically connect the n-type electrode 64 formed on the first conductive type semiconductor layer 54 and the p-type electrode pads 66 formed on the respective portions of the transparent electrode structure 62, respectively.

The wires 68 connect the light emitting cells 57 in series, so that a serial array of the light emitting cells is formed. A plurality of such arrays may be formed, and the plurality of arrays may be connected in reverse parallel to one another to be connected to an AC power source. Further, a bridge rectifier (not shown) may be formed to be connected to the serial array of the light emitting cells, and the light emitting cells may be driven under AC power by means of the bridge rectifier.

According to this embodiment, since the transparent electrode structure 62 comprises the at least two separate portions, the current flowing into the transparent electrode structure 62 through the wires 68 is dispersed into the respective separate portions. Thus, the current can be prevented from being concentrated on a region as compared with the conventional single electrode (designated by 22 in FIG. 1). Further, since each of the portions has a shape elongated in the direction, in which the current flows, i.e., an x direction, the current can be prevented from being concentrated even in a region of the respective portions.

FIGS. 5 to 7 are sectional views illustrating a method of manufacturing the AC LED according to the embodiment of the present invention.

Referring to FIG. 5, a first conductive type semiconductor layer 54, an active layer 56 and a second conductive type semiconductor layer 60 are formed on a substrate 50. Further, a buffer layer 52 may be formed before the first conductive type semiconductor layer 54 is formed.

The substrate 50 may be a substrate of $Al_2O_3$, SiC, ZnO, Si, GaAs, GaP, $LiAl_2O_3$, BN, AlN or GaN. However, the substrate 50 is not limited thereto but may be variously selected depending on a material of a semiconductor layer to be formed on the substrate 50. In a case where a GaN based semiconductor layer is formed, a sapphire or SiC substrate is mainly used as the substrate 50.

The buffer layer 52 is formed to reduce lattice mismatch between the substrate 50 and the first semiconductor layer 54 formed thereon, and may be formed, for example, of GaN or AlN. When the substrate 50 is a conductive substrate, it is preferred that the buffer layer 52 be formed of an insulation or semi-insulation layer. Further, the buffer layer 52 may be formed of AlN or semi-insulation GaN.

Each of the first conductive type semiconductor layer 54, the active layer 56 and the second conductive type semiconductor layer 60 may be formed of a GaN based semiconductor material, i.e., (B, Al, In, Ga)N. A composition element and a composition ratio of the active layer 56 are determined such that the active layer 56 emits light with a desired wavelength. Each of the first and second conductive type semiconductor layers 54 and 60 is formed of a material with a band gap larger than that of the active layer 56. The first and second conductive type semiconductor layers 54 and 60 and the active layer 56 may be intermittently or continuously grown using a technology such as metal organic chemical vapor deposition (MOCVD), molecular beam epitaxy, or hydride vapor phase epitaxy (HVPE).

Here, the first and second conductive types may be n-type and p-type, or p-type and n-type, respectively. In a GaN based compound semiconductor layer, an n-type semiconductor layer may be formed by being doped with Si as an impurity, and a p-type semiconductor layer may be formed by being doped with Mg as an impurity.

Referring to FIG. 6, the second conductive type semiconductor layer 60, the active layer 56 and the first conductive type semiconductor layer 54 are patterned to form the light emitting cells 57 spaced apart from one another. At this time, the buffer layer 52 may be patterned together. The first and second conductive type semiconductor layers 54 and 60 and the active layer 56 may be patterned through a photolithography and etching process.

Meanwhile, the second conductive type semiconductor layer 60 and the active layer 56 are patterned to be positioned on one region of the patterned first conductive type semiconductor layer 54, as shown in the figure. Accordingly, a portion of the patterned first conductive type semiconductor layer 54 is exposed.

Referring to FIG. 7, a transparent electrode structure 62 is formed on the patterned second conductive type semiconductor layer 60. The transparent electrode structure 62 may be formed to have at least two portions separated from each other, as shown in FIG. 3, using a lift-off technology. Alternatively, after forming a transparent electrode layer using a deposition technology such as e-beam evaporation, the transparent electrode layer may be patterned through a photolithography and etching process to form the transparent electrode structure 62 with at least two portions. The transparent electrode structure 62 can be formed of any electrode material as long as it can transmit the light emitted from the active layer 56, and is not specifically limited. For example, the transparent electrode structure 62 may be formed of Ni/Au or indium tin oxide (ITO).

Although it is described in this embodiment that the transparent electrode structure 62 is formed after the light emitting cells 57 are formed, the present invention is not limited thereto, but the transparent electrode structure 62 may be formed before the light emitting cells are separated from one another. Particularly, when a transparent electrode layer is deposited through an e-beam evaporation technology, it is preferred that the transparent electrode layer be formed after the second conductive type semiconductor layer 60 is grown and before the light emitting cells 57 are separated from one another. Thereafter, before the wires 68 are formed, the transparent electrode layer is patterned to form the transparent electrode structure 62 in a predetermined step.

P-type electrode pads 66 may be locally formed on regions of the transparent electrode structure 62. The p-type electrode pads 66 may be formed through a lift-off technology. Meanwhile, before the p-type electrode pads 66 are formed, the transparent electrode structure 62 may be patterned to form openings (not shown) through which the second conductive type semiconductor layer 60 is exposed. Thereafter, the p-type electrode pads 66 are formed on the openings and the peripheral portions thereof. As a result, the p-type electrode pads 66 may be brought into contact with the second conductive type semiconductor layer 60 through the openings.

Meanwhile, the n-type electrode 64 may be formed on other region of the first conductive type semiconductor layer 54. The n-type electrode 64 may also be formed through a lift-off technology, and simultaneously formed together with the p-type electrode pads 66. The p-type electrode pads 66 and/or n-type electrode 64 may be formed of Ti/Au.

Subsequently, the wires 68 electrically connecting the light emitting cells 57 adjacent to each other are formed. The wires can connect the n-type electrodes 64 and the p-type electrode pads 66, so that the LED described with reference to FIGS. 3 and 4 is formed.

The wires 68 may be formed through an air-bridge process, and FIG. 4 illustrates the wires formed through the air-bridge process. The wires 68 may also be formed through a step-cover process.

First, an example of the air-bridge process will be briefly described. After photoresist is formed on the substrate 50 having the n-type electrodes 64 and the p-type electrode pads 66 formed thereon as shown in FIG. 7, a first photoresist pattern with openings exposing the n-type electrodes 64 and the p-type electrode pads 66 is formed through an exposing process. Thereafter, a thin metal layer is formed through an e-beam evaporation technology. The metal layer is formed on the entire surface of the openings and the photoresist pattern. Subsequently, a second photoresist pattern exposing the metal layer in the openings and the regions between the adjacent light emitting cells to be connected to each other is formed on the first photoresist pattern. Thereafter, gold or the like is formed through a plating technology, and then both the first and second photoresist patterns are removed. As a result, the wires respectively connecting the n-type electrodes 64 and p-type electrode pads 66 of the light emitting cells adjacent to each other are left, and all the other metal layer and photoresist patterns are removed. As shown in the figure, the wires electrically connect the light emitting cells 57 in a bridge form.

Meanwhile, the step-cover process comprises a step of forming an insulation layer on the substrate having the n-type electrodes 64 and the p-type electrode pads 66 as shown in FIG. 7. Thereafter, the insulation layer is patterned through a photolithography and etching process to form openings exposing the n-type electrodes 64 and the p-type electrode pads 66. Subsequently, through an e-beam evaporation technology, the openings are filled and the metal layer covering the top surface of the insulation layer is formed. Thereafter, the metal layer is patterned through a photolithography and etching technology to form the wires 68 connecting the light emitting cells 57 adjacent to each other. A variety of modifications of such a step-cover process can be applied. If the step-cover process is used, the wires 68 are supported by the insulation layer, thereby increasing the reliability.

The wires 68 may be formed to be separated from each other on the n-type electrodes 64, as shown in FIG. 3, but may also be connected to each other on the n-type electrodes 64.

FIG. 8 is a plan view illustrating an AC LED according to another embodiment of the present invention.

The AC LED according to this embodiment has the configurations generally identical with the AC LED described with reference to FIG. 3. However, in the AC LED according to this embodiment, a transparent electrode structure 72 is divided into three portions, and wires 78 are connected to one another on n-type electrodes 64.

The transparent electrode structure 72 may be divided into the portions of a shape elongated along the x direction. The transparent electrode structure 72 may be divided into various numbers of portions to prevent the current from being locally concentrated.

Meanwhile, in a case where the wires 78 are connected to one another on the n-type electrodes 64, adhesion between the wires and the n-type electrodes may be enhanced. However, the wires 78 may be separated from one another on the n-type electrodes.

FIG. 9 is a plan view illustrating an AC LED according to a further embodiment of the present invention.

Referring to FIG. 9, the AC LED according to this embodiment has the configurations generally identical with the AC LED described with reference to FIG. 3. However, a transparent electrode structure 82 is different from the transparent electrode structure 62 of FIG. 3. Accordingly, wires 88 are different from the wires 68 of FIG. 3. Hereinafter, the differences will be described.

The transparent electrode structure 82 comprises a center portion 82a and branches 82b extending laterally from both sides of the center portion 82a. The center portion 82a may have a shape elongated in the direction in which the current flows between light emitting cells, i.e., the x direction. Further, the branches 82b extend in the direction, i.e., the y direction perpendicular to the direction in which the current flows.

Meanwhile, the wires 88 electrically connect the light emitting cells adjacent to each other. The wire 88 electrically connects an n-type electrode 64 and the transparent electrode structure 82, and particularly, may electrically connect the center portion 82a of the transparent electrode structure 82 and the n-type electrode 64.

Accordingly, the current can be prevented from being concentrated on a region in the center portion 82a, and can be dispersed in a light emitting cell region through the branches 82b.

The invention claimed is:

1. A light emitting diode (LED), comprising:
   a plurality of light emitting cells formed on a single substrate, each of the light emitting cells comprising a first conductive type semiconductor layer, a second conductive type semiconductor layer positioned on a first region of the first conductive type semiconductor layer, and an active layer interposed between the first and second conductive type semiconductor layers;
   a transparent electrode structure positioned on the second conductive type semiconductor layer of each of the light emitting cells, the transparent electrode structure comprising at least two portions completely separated from each other; and
   wires electrically connecting adjacent two of the light emitting cells so that each of the at least two portions of the transparent electrode structure positioned on one of the adjacent two light emitting cells is electrically connected to the first conductive type semiconductor layer of other of the adjacent two light emitting cells,
   wherein the at least two portions of the transparent electrode structure contact the second conductive type semiconductor layer positioned on the first region of the first conductive type semiconductor layer.

2. The LED as claimed in claim 1, wherein each of the at least two portions of the transparent electrode structure comprises a shape elongated in a direction in which current flows between the light emitting cells.

3. The LED as claimed in claim 1, further comprising:
   an n-type electrode formed on a second region of the first conductive type semi-conductor layer in each of the light emitting cells; and
   p-type electrode pads respectively formed on the at least two portions of the transparent electrode structure on each of the light emitting cells,
   wherein the wires electrically connect the n-type electrodes and the p-type electrode pads.

4. A light emitting diode (LED), comprising:
   a plurality of light emitting cells formed on a single substrate, each of the light emitting cells comprising a first conductive type semiconductor layer, a second conductive type semiconductor layer positioned on a first region of the first conductive type semiconductor layer, and an active layer interposed between the first and second conductive type semiconductor layers;
   a transparent electrode structure positioned on each of the light emitting cells, the transparent electrode structure comprising a contiguous center portion having a plurality of branches extending from a first side of the center portion and a plurality of branches extending from a second side of the center portion; and
   wires each electrically connecting adjacent two of the light emitting cells so that the transparent electrode structure positioned on one of the adjacent two light emitting cells is electrically connected to the first conductive type semiconductor layer of other of the adjacent two light emitting cells.

5. The LED as claimed in claim 4, wherein the center portion comprises a shape elongated in a direction in which current flows between the light emitting cells, and the branches extend perpendicular to the direction in which the current flows.

6. The LED as claimed in claim 4, further comprising:
an n-type electrode formed on a second region of the first conductive type semi-conductor layer in each of the light emitting cells; and
a p-type electrode pad formed on the center portion of the transparent electrode structure on each of the light emitting cells,
wherein each of the wires electrically connects the n-type electrode and the p-type electrode pad.

7. The LED of claim 1, wherein the wires comprise a first wire connecting a first portion of the at least two portions of the transparent electrode and a second wire connecting a second portion of the at least two portions of the transparent electrode.

* * * * *